US012419000B2

(12) United States Patent
Dong et al.

(10) Patent No.: US 12,419,000 B2
(45) Date of Patent: Sep. 16, 2025

(54) MIDDLE FRAME ASSEMBLY AND DISPLAY DEVICE

(71) Applicant: BOE Technology Group Co., Ltd., Beijing (CN)

(72) Inventors: Liming Dong, Beijing (CN); Shouchuan Zhang, Beijing (CN); Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 190 days.

(21) Appl. No.: 18/026,829

(22) PCT Filed: Oct. 18, 2021

(86) PCT No.: PCT/CN2021/124321
§ 371 (c)(1),
(2) Date: Mar. 17, 2023

(87) PCT Pub. No.: WO2022/111123
PCT Pub. Date: Jun. 2, 2022

(65) Prior Publication Data
US 2023/0337379 A1    Oct. 19, 2023

(30) Foreign Application Priority Data
Nov. 26, 2020  (CN) .................. 202011346023.X (51) Int. Cl.
*H05K 5/00*      (2025.01)
*F16C 11/04*     (2006.01)
*H05K 5/02*      (2006.01)

(52) U.S. Cl.
CPC ............ *H05K 5/0226* (2013.01); *F16C 11/04* (2013.01)

(58) Field of Classification Search
CPC ..... H05K 5/0226; F16C 11/04; G06F 1/1652; G09F 9/301; Y02E 10/50
See application file for complete search history.

(56) References Cited

U.S. PATENT DOCUMENTS 8,971,031 B2    3/2015  Mok et al.
9,696,763 B2    7/2017  Mok et al.
(Continued)

FOREIGN PATENT DOCUMENTS

CN    103167071 A    6/2013
CN    103576775 A    2/2014
(Continued)

OTHER PUBLICATIONS

International Search Report and Written Opinion mailed on Jan. 19, 2022, in corresponding PCT/CN2021/124321, 10 pages.
(Continued)

*Primary Examiner* — Rockshana D Chowdhury
(74) *Attorney, Agent, or Firm* — XSENSUS LLP (57) ABSTRACT

A middle frame assembly and a display device. The middle frame assembly includes a rotating shaft component, a first middle frame body, a first sliding middle frame, and a first transmission component. The first transmission component includes a first driving bevel gear, a second driving bevel gear, a first driven bevel gear, and a transmission part. The first driving bevel gear and the second driving bevel gear can rotate in a first axial direction under the action of rotation of the first middle frame body relative to the rotating shaft component. A circumference of a pitch circle of the second driving bevel gear is greater than that of the first driving bevel gear. The first driven bevel gear is configured to mesh with the first driving bevel gear in a first state and with the second driving bevel gear in a second state.

19 Claims, 6 Drawing Sheets

(56) References Cited

U.S. PATENT DOCUMENTS

| | | | |
|---|---|---|---|
| 9,778,468 B2 | 10/2017 | Yang et al. | |
| 10,154,124 B2 | 12/2018 | Mok et al. | |
| 10,659,576 B1 | 5/2020 | Hsu et al. | |
| 10,659,584 B2 | 5/2020 | Mok et al. | |
| 10,890,949 B2* | 1/2021 | Ou | H04M 1/0216 |
| 11,314,285 B2* | 4/2022 | Feng | G06F 1/1652 |
| 11,647,598 B2* | 5/2023 | Zhang | G06F 1/1652 |
| | | | 361/807 |
| 11,689,651 B2* | 6/2023 | Feng | H04M 1/0237 |
| | | | 455/566 |
| 11,768,519 B2* | 9/2023 | Feng | G06F 1/1637 |
| | | | 361/679.27 |
| 11,800,661 B2* | 10/2023 | Liu | H04M 1/0237 |
| 11,974,406 B2* | 4/2024 | Lee | G06F 1/1637 |
| 12,016,144 B2* | 6/2024 | Han | H04M 1/0268 |
| 12,101,423 B2* | 9/2024 | Li | G06F 1/1624 |
| 12,130,668 B2* | 10/2024 | Liu | G09F 9/301 |
| 2006/0238968 A1 | 10/2006 | Maatta et al. | |
| 2014/0042293 A1 | 2/2014 | Mok et al. | |
| 2015/0153787 A1 | 6/2015 | Mok et al. | |
| 2015/0221065 A1 | 8/2015 | Kim et al. | |
| 2016/0334627 A1 | 11/2016 | Yang et al. | |
| 2017/0264723 A1 | 9/2017 | Mok et al. | |
| 2019/0075196 A1 | 3/2019 | Mok et al. | |
| 2020/0117245 A1 | 4/2020 | Ou et al. | |
| 2020/0280624 A1 | 9/2020 | Mok et al. | |
| 2020/0352044 A1 | 11/2020 | Hsu | |
| 2024/0430349 A1* | 12/2024 | Cho | G09F 9/301 |

FOREIGN PATENT DOCUMENTS

| | | |
|---|---|---|
| CN | 104898279 A | 9/2015 |
| CN | 104898282 A | 9/2015 |
| CN | 104898279 B | 12/2017 |
| CN | 108122492 A | 6/2018 |
| CN | 109681521 A | 4/2019 |
| CN | 208737802 U | 4/2019 |
| CN | 208890845 U | 5/2019 |
| CN | 110166591 A | 8/2019 |
| CN | 110266836 A | 9/2019 |
| CN | 110273915 A | 9/2019 |
| CN | 110796958 A | 2/2020 |
| CN | 110992833 A | 4/2020 |
| CN | 111199686 A | 5/2020 |
| CN | 210443169 U | 5/2020 |
| CN | 110992833 B | 10/2020 |
| CN | 111862813 A | 10/2020 |
| CN | 111862827 A | 10/2020 |
| CN | 211628599 U | 10/2020 |
| CN | 111882994 A | 11/2020 |
| CN | 111915988 A | 11/2020 |
| CN | 211980060 U | 11/2020 |
| CN | 112466211 A | 3/2021 |
| CN | 112639925 A | 4/2021 |
| CN | 213123611 U | 5/2021 |
| EP | 2696257 A2 | 2/2014 |
| EP | 2696257 B1 | 11/2019 |
| EP | 3660624 A1 | 6/2020 |
| IN | 109979324 A | 7/2019 |
| KR | 10-2036913 B1 | 10/2019 |
| TW | I703428 B | 9/2020 |
| WO | 2013/076710 A2 | 5/2013 |
| WO | 2020/037507 A1 | 2/2020 |

OTHER PUBLICATIONS

Office Action issued on Jan. 30, 2022, in corresponding Chinese patent Application No. 202011346023.X, 25 pages.
Notice of Allowance issued on Jun. 22, 2022, in corresponding Chinese patent Application No. 202011346023.X, 7 pages.

* cited by examiner

- Prior Art -

MIDDLE FRAME ASSEMBLY AND DISPLAY DEVICE

CROSS REFERENCE TO RELATED APPLICATION

The present disclosure is the U.S. national phase application of International Application No. PCT/CN2021/124321 filed on Oct. 18, 2021, which claims priority of the Chinese patent application No. 202011346023. X, filed on Nov. 26, 2020 and entitled "MIDDLE FRAME ASSEMBLY AND DISPLAY DEVICE", the content of which are incorporated herein by reference in their entireties for all purposes.

TECHNICAL FIELD

The present disclosure relates to the field of display technology, in particular to a middle frame assembly and a display device.

BACKGROUND

A bendable display device generally includes a middle frame assembly and a flexible display panel. The middle frame assembly is fixed on a side of the flexible display panel away from a display side thereof. The flexible display panel and the middle frame assembly follow different bending paths during a inward-folding process (bending towards the display side) or an outward-folding process (bending away from the display side) of the bendable display device. When the display device is folded inwardly, a bending path of the middle frame assembly is greater than that of the display panel. When the display device is folded outwardly, the bending path of the middle frame assembly is smaller than that of the display panel. If the display panel is fixed on the middle frame assembly, the display panel and the middle frame assembly will be staggered when the display device is bent, resulting in the separation of the display panel and the middle frame assembly.

It should be noted that information disclosed in the background is only intended to strengthen the understanding of the background of the present disclosure, and information that does not constitute the prior art known to those of ordinary skill in the art may not be included.

SUMMARY

According to one aspect of the present disclosure, there is provided a middle frame assembly, which includes: a rotation shaft component; a first middle frame body rotationally connected to one side of the rotation shaft component along a first axial direction; a first sliding middle frame configured to be fixedly connected to one end of a flexible panel, wherein the first sliding middle frame is slidely connected to a side of the first middle frame body away from the rotation shaft component along a first direction, and the first direction is a direction along which getting close to or away from the rotation shaft component; and a first transmission component including a first sub-transmission component, wherein the first sub-transmission component includes: a first driving bevel gear connected to the first middle frame body and rotatable along the first axial direction under the action of rotation of the first middle frame body relative to the rotation shaft component; a second driving bevel gear connected to the first middle frame body and rotatable along the first axial direction under the action of the rotation of the first middle frame body relative to the rotation shaft component, wherein a circumference of a pitch circle of the second driving bevel gear is greater than a circumference of a pitch circle of the first driving bevel gear; a first driven bevel gear fixedly connected to the first middle frame body, and configured to mesh with the first driving bevel gear in a first state and with the second driving bevel gear in a second state, wherein the first driven bevel gear is rotatable along a second axial direction under the action of the first driving bevel gear or the second driving bevel gear; and a transmission part connected to the first driven bevel gear and the first sliding middle frame, and configured to drive the first sliding middle frame to slide along the first direction relative to the first middle frame body under the action of rotation of the first driven bevel gear.

According to one aspect of the present disclosure, there is provided a display device, which includes a flexible display panel and the middle frame assembly described above, wherein the first sliding middle frame of the middle frame assembly is fixedly connected to one end of the flexible display panel, and the second sliding middle frame of the middle frame assembly is fixedly connected to the other end of the flexible display panel.

It should be understood that the above general description and the following detailed description are only illustrative and explanatory, and do not limit the present disclosure.

BRIEF DESCRIPTION OF THE DRAWINGS

The drawings, which are incorporated in and constitute a part of this specification, illustrate embodiments consistent with the present disclosure and serve together with the specification to explain the principle of the present disclosure. It is apparent that the drawings in the following description are only some embodiments of the present disclosure, and for those of ordinary skill in the art, other drawings can also be obtained from these drawings without creative efforts.

DETAILED DESCRIPTION

Example embodiments will now be described more comprehensively with reference to the accompanying drawings.

However, the example embodiments can be implemented in many forms and should not be understood as limited to the examples described herein. On the contrary, provision of these embodiments will make the present disclosure more comprehensive and complete, and will comprehensively convey the concept of the example embodiments to those skilled in the art. The same reference numerals in the figure represent the same or similar structures, of which detailed description will be omitted.

Although relativity terms are used in this specification, such as "up" and "down" are used to describe a relative relationship of one component relative to another component, these terms are used in this specification for convenience only, for example, according to directions of examples described in the drawings. It can be understood that if the device in the figure is turned upside down, the component described in "up" will become the component described in "down". Other relativity terms, such as "high", "low", "top", "bottom", "left" and "right", also have similar meanings. When a structure is "on" other structures, it may mean that a structure is integrally formed on other structures, or that a structure is "directly" arranged on other structures, or that a structure is "indirectly" arranged on other structures via another structure.

Terms "a", "an" and "the" are used to indicate presence of one or more elements/components/etc. Terms "include" and "have" are used to express the open inclusion and refer to presence of other elements/components/etc., in addition to the listed elements/components/etc.

Figure 1:
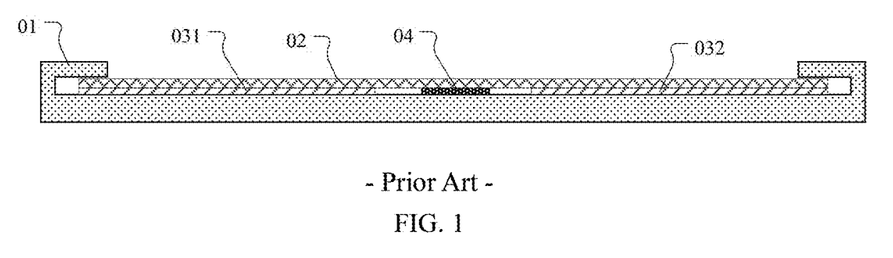
FIG. 1 is a schematic structural diagram of a flexible display device in the related technology.

FIG. 1 is a schematic structural diagram of a flexible display device in the related technology. In the related technology, the flexible display device includes an outer frame 01 for the whole machine, a flexible display panel 02, sliding blocks 031 and 032, and a rotation shaft 04. The flexible display panel 02 is fixedly connected with the sliding blocks 031 and 032, and is fixedly connected with the rotation shaft 04 by interference. The sliding blocks 031 and 032 can slide relative to the outer frame 01. In the outward-folding process (i.e. a first state) of the flexible display device (bending away from the display side), a bending path of the outer frame 01 is smaller than that of the flexible display panel, and the sliding blocks 031 and 032 slide in a direction facing towards the rotation shaft 04 relative to the outer frame 01. In the inward-folding process (i.e. a second state) of the flexible display device (bending towards the display side), the bending path of the outer frame 01 is greater than that of the flexible display panel, and the sliding blocks 031 and 032 slide in a direction away from the rotation shaft 04 relative to the outer frame 01. In the outward-folding process, in order to limit the flexible display panel 02 within the outer frame 01, "U" slots need to be arranged on both left and right sides of the outer frame 01 to limit the flexible display panel 02. In the inward-folding process, in order to avoid collision between the flexible display panel 02 and borders on the left and right sides of the outer frame 01, the flexible display panel 02 needs to be separated from the borders on the left and right sides of the outer frame 01 at a certain distance when the flexible display device is flattened. Therefore, the flexible display device needs to be provided with a larger border, which is not conducive to the realization of the narrow border display device.

Figure 2:
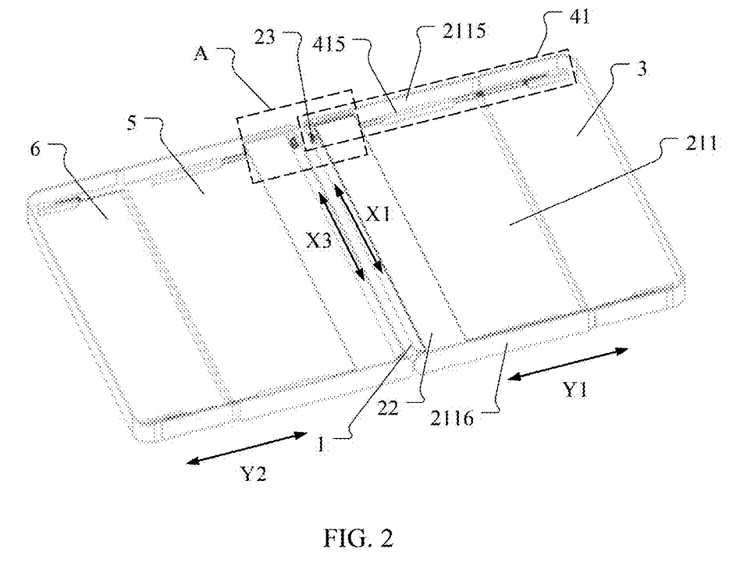
FIG. 2 is a schematic structural diagram of a middle frame assembly according to exemplary embodiments of the present disclosure.
Figure 3:
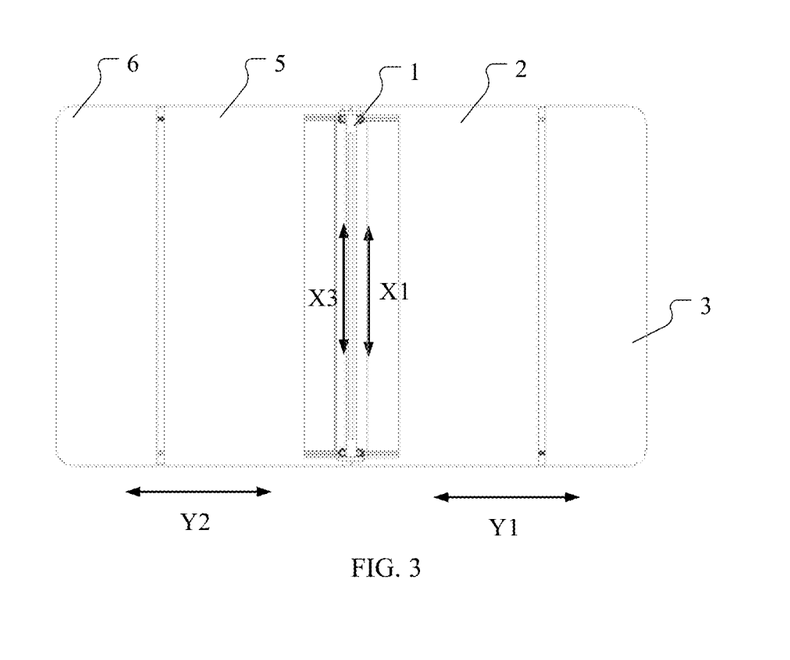
FIG. 3 is a top view of a middle frame assembly according to exemplary embodiments of the present disclosure.
Figure 4:
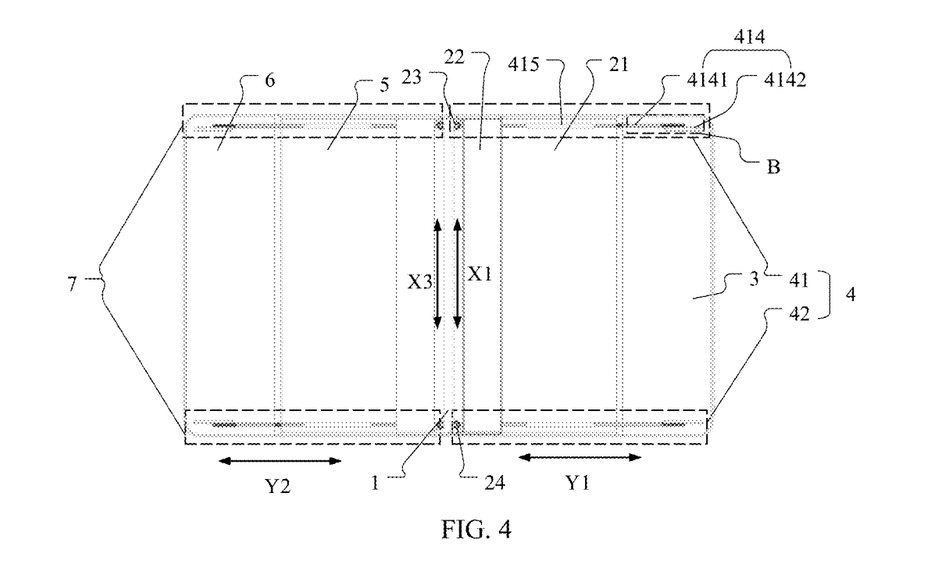
FIG. 4 is a bottom view of a middle frame assembly according to exemplary embodiments of the present disclosure.
Figure 5:
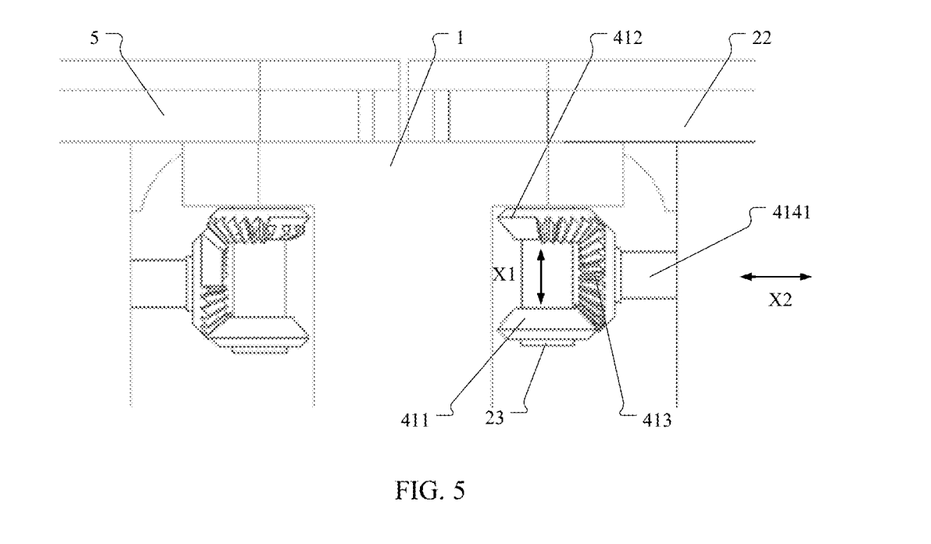
FIG. 5 is a partial enlarged view at dashed box A in FIG. 2.

Exemplary embodiments of the present disclosure provide a middle frame assembly, as shown in FIGS. 2-5. FIG. 2 is a schematic structural diagram of a middle frame assembly according to exemplary embodiments of the present disclosure, FIG. 3 is a top view of a middle frame assembly according to exemplary embodiments of the present disclosure, FIG. 4 is a bottom view of a middle frame assembly according to exemplary embodiments of the present disclosure, and FIG. 5 is a partial enlarged view at dashed box A in FIG. 2. The middle frame assembly can include a rotation shaft component 1, a first middle frame body 2, a first sliding middle frame 3, and a first transmission component 4. The first middle frame body 2 can be rotationally connected to a side of the rotation shaft component 1 along a first axial direction X1. The first sliding middle frame 3 is configured to be fixedly connected with one end of the flexible panel. The first sliding middle frame 3 can be slidely connected to a side of the first middle frame body 2 away from the rotation shaft component 1 along a first direction Y1, and the first direction Y1 is a direction along which getting close to the rotation shaft component or away from the rotation shaft component. The first transmission component 4 can include a first sub-transmission component 41. The first sub-transmission component 41 can include a first driving bevel gear 411, a second driving bevel gear 412, a first driven bevel gear 413, and a transmission part 414. The first driving bevel gear 411 can be connected to the first middle frame body 2, and can rotate along the first axial direction X1 under the action of rotation of the first middle frame body 2 relative to the rotation shaft component 1. The second driving bevel gear 412 can be connected to the first middle frame main body 2, and can rotate along the first axial direction X1 under the action of rotation of the first middle frame body 2 relative to the rotation shaft component 1. A circumference of a pitch circle of the second driving bevel gear 412 can be greater than that of the first driving bevel gear 411. The first driven bevel gear 413 is connected to the first middle frame main body 2, and is configured to mesh with the first driving bevel gear 411 in a first state and to mesh with the second driving bevel gear 412 in a second state. The first driven bevel gear 413 can rotate along a second axial direction X2 under the action of the first driving bevel gear 411 or the second driving bevel gear 412, and the second axial direction X2 can be parallel to the first direction Y1. The transmission part 414 is connected with the first driven bevel gear 413 and the first sliding middle frame 3, and is configured to drive the first sliding middle frame 3 to slide along the first direction Y1 relative to the first middle frame body 2 under the action of rotation of the first driven bevel gear 413. Herein, the first direction Y1 can be perpendicular to the first axial direction X1.

The middle frame assembly provided by exemplary embodiments of the present disclosure can be used to fix the flexible panel, which can be fixed on a side shown in FIG. 3. On the one hand, when the middle frame assembly is folded outwardly from a flattened state, that is, the first middle frame body 2 rotates in a direction away from the flexible panel relative to the rotation shaft component 1, the first driving bevel gear 411 meshes with the first driven bevel gear 413, the first driving bevel gear 411 drives the first driven bevel gear 413 to rotate along the second axial direction X2, and the transmission part 414 drives the first sliding middle frame to slide towards a side close to the first middle frame body 2 under the action of rotation of the first driven bevel gear 413. When the middle frame assembly is folded inwardly from a flattened state, that is, the first middle frame body 2 rotates in a direction facing the flexible panel relative to the rotation shaft component 1, the second driving bevel gear 412 meshes with the first driven bevel gear 413, the second driving bevel gear 412 drives the first driven bevel gear 413 to rotate along the second axial direction X2, and the transmission part 414 drives the first sliding middle frame to slide towards a side away from the first middle frame body 2 under the action of rotation of the first driven bevel gear 413. The middle frame assembly can avoid staggering between the flexible panel and the middle frame assembly by compensating sliding amount of the flexible panel when being bent. When the flexible panel is a flexible display panel, since the flexible display panel is fixedly connected to the middle frame assembly, the middle frame assembly does not need to be provided with a border for accommodating the flexible display panel, so that the borderless display can be achieved. On the other hand, the sliding amount of the flexible panel that needs to be compensated when the middle frame assembly is folded inwardly is greater than the sliding amount of the flexible panel that needs to be compensated when the middle frame assembly is folded outwardly, thus in exemplary embodiments, the circumference of the pitch circle of the second driving bevel gear 412 is greater than that of the first driving bevel gear 411, that is, a transmission length of the second driving bevel gear 412 in one-turn rotation is greater than a transmission length of the first driving bevel gear 411 in one-turn rotation. Such arrangement can allow the first sliding middle frame 3 to have a different sliding length relative to the first middle frame body 2 in the outward-folding and inward-folding process of the middle frame assembly, so as to match with and compensate different sliding amount required in the outward-folding and inward-folding process of the flexible panel.

In some exemplary embodiments, as shown in FIGS. 2-4, the middle frame assembly can further include a second middle frame body 5, a second sliding middle frame 6, and a second transmission component 7. The second middle frame body 5 is rotationally connected to the other side of the rotation shaft component 1 along a third axial direction X3. The second sliding middle frame 6 is configured to be fixedly connected with the other end of the flexible panel. The second sliding middle frame 6 is slidely connected to a side of the second middle frame body 5 away from the rotation shaft component 1 along a second direction Y2, and the second direction Y2 is a direction along which getting close to the rotation shaft component 1 or away from the rotation shaft component 1. The second transmission component 7 can be connected between the second middle frame body 5 and the second sliding middle frame 6, and is configured to drive the second sliding middle frame 6 to slide along the second direction Y2 relative to the second middle frame body 5 under the action of rotation of the second middle frame body 5 relative to the rotation shaft component 1.

In some exemplary embodiments, the first middle frame body 2 and the second middle frame body 5 may have the same structure, the first sliding middle frame 3 and the second sliding middle frame 6 may have the same structure, and the first transmission component 4 and the second transmission component 7 may have the same structure. In some exemplary embodiments, the first middle frame body 2 and the second middle frame body 5 can be symmetrically arranged on both sides of the rotation shaft component 1. The first middle frame body 2 and the second middle frame body 5 can realize folding of the flexible panel through each of whose bending of 90 degrees. Such arrangement can reduce a local bending angle when the flexible panel is folded.

Figure 6:
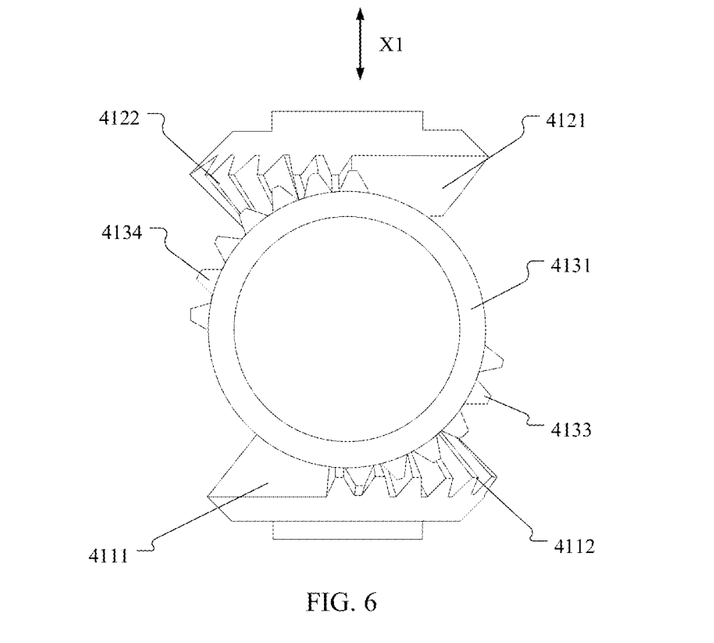
FIG. 6 is a partial right view of FIG. 5.

In some exemplary embodiments, as shown in FIGS. 5 and 6, with FIG. 6 being a partial right view of FIG. 5, the first driving bevel gear 411 can include a first conical base 4111 and a first tooth group 4112. The first tooth group 4112 is formed on a quarter circumference of a conical surface of the first conical base 4111. The second driving bevel gear 412 can include a second conical base 4121 and a second tooth group 4122, and the second tooth group 4122 is formed on a quarter circumference of a conical surface of the second conical base 4121. The first driven bevel gear 413 can include a third conical base 4131, a third tooth group 4133, and a fourth tooth group 4134. The third tooth group 4133 is formed on a conical surface of the third conical base 4131. The fourth tooth group 4134 is formed on the conical surface of the third conical base 4131, and the third tooth group 4133 and the fourth tooth group 4134 can be arranged at intervals on the conical surface of the third conical base 4131. In some exemplary embodiments, the first driven bevel gear 413 can mesh with the first tooth group 4112 through the third tooth group 4133 in the first state (i.e. in the the outward-folding process), and can mesh with the second tooth group 4122 through the fourth tooth group 4134 in the second state (i.e. in the inward-folding process). The number of teeth of the fourth tooth group 4134 can be greater than that of the third tooth group 4133.

Figure 7:
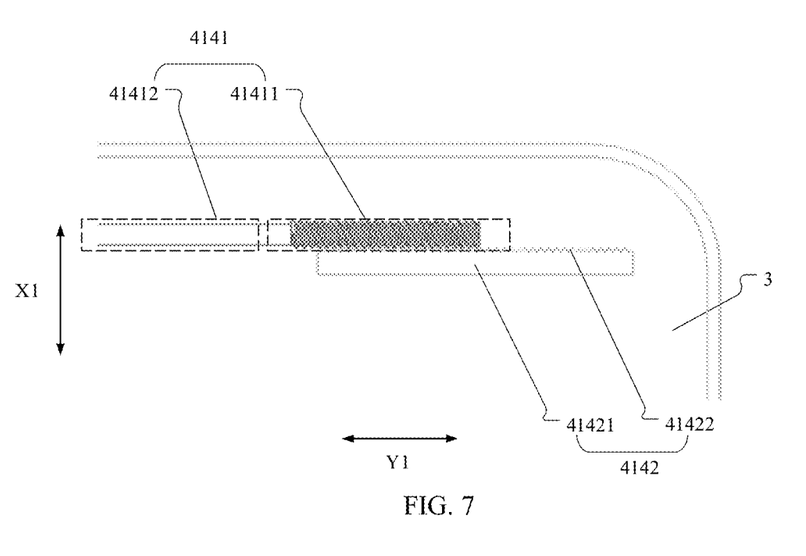
FIG. 7 is a partial enlarged view at dashed box B in FIG. 2.
Figure 8:
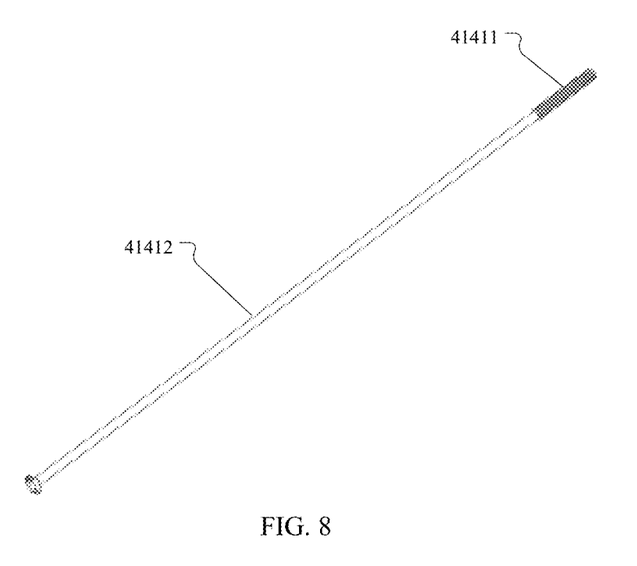
FIG. 8 is a schematic structural diagram of a first worm of a middle frame assembly according to exemplary embodiments of the present disclosure.

In some exemplary embodiments, as shown in FIGS. 4, 7 and 8, with FIG. 7 being a partial enlarged view at dotted box B in FIG. 4 and FIG. 8 being a schematic structural diagram of a first worm of a middle frame assembly according to exemplary embodiments of the present disclosure, the transmission part 414 can include a first worm 4141 and a first rack 4142. The first worm 4141 can be fixedly connected to the first driven bevel gear 413 and extends along the second axial direction X2. The first worm 4141 can include a first threaded part 41411 with threaded teeth. The first rack 4142 can be fixedly connected to the first sliding middle frame 3 and extends along the first direction Y1. The first rack 4142 can mesh with the first threaded part 41411. When the first worm 4141 rotates along the second axial direction under the action of the first driven bevel gear 413, the first worm 4141 can pull the first sliding middle frame 3 through the first rack 4142 to move along the first direction. It should be understood that in other exemplary embodiments, the transmission part 414 can also be of other structures. For example, other transmission parts can also be provided between the first worm 4141 and the first rack 4142, to realize the pulling effect of the first worm 4141 on the first rack 4142 along the first direction.

In some exemplary embodiments, as shown in FIGS. 2, 4 and 5, the first middle frame body 2 can include a first main middle frame 21 and a first rotation shaft 23. The first main middle frame 21 is slidely connected with the first sliding middle frame 3. The first rotation shaft 23 can be fixedly connected to the first main middle frame 21. An axial direction of the first rotation shaft 23 is the same as the first axial direction X1. In some exemplary embodiments, the first driving bevel gear 411 and the second driving bevel gear 412 can be coaxially and fixedly connected to the first rotation shaft 23. That is, when the first main middle frame 21 rotates relative to the rotation shaft component 1, the first driving bevel gear 411 and the second driving bevel gear 412 can rotate via the first rotation shaft 23.

In some exemplary embodiments, as shown in FIGS. 2, 4 and 5, the first main middle frame 21 can be rotationally connected with the rotation shaft component 1 via the first rotation shaft 23. It should be understood that in other exemplary embodiments, the first main middle frame can also be rotationally connected with the rotation shaft component 1 via other rotation shafts other than the first rotation shaft. As long as the axial direction of the first rotation shaft is the same as the first axial direction, the first driving bevel gear 411 and the second driving bevel gear 412 can rotate under the action of rotation of the first main middle frame 21 relative to the rotation shaft component 1.

In some exemplary embodiments, as shown in FIG. 4, the first middle frame body can also include a second rotation shaft 24. The second rotation shaft 24 can be fixedly connected with the first main middle frame 21, and the first main middle frame 21 can be rotationally connected with the rotation shaft component 1 via the second rotation shaft 24. The first transmission component 4 can also include a second sub-transmission component 42. The second sub-transmission component 42 can be of the same structure as the first sub-transmission component 41. The second sub-transmission component 42 and the first sub-transmission component 41 are arranged at intervals in the first axial direction X1. The second sub-transmission component 42 can be connected between the second rotation shaft 24 and the first sliding middle frame 3. The second sub-transmission component 42 and the first sub-transmission component 41 can have the same structure and connection relationship. The two sub-transmission components can enable the middle frame assembly to have better stability. It should be understood that in other exemplary embodiments, the first transmission component may also include other number of sub-transmission components, such as three sub-transmission components, four sub-transmission components, etc.

In some exemplary embodiments, since a length of the first worm 4141 is long, the first threaded part 41411 will be easy to generate a large end disturbance in the radial direction thereof, which affects the meshing of the first threaded part 41411 and the first rack 4142. As shown in FIGS. 2 and 4, the first sub-transmission component 41 can also include a first support part 415. The first support part 415 can be fixedly connected to a side of the first main middle frame 21 away from the flexible panel. The first support part 415 can be provided with a through hole extending along the first direction Y1, and the first worm 4141 can be rotationally connected in the through hole. The first support part 415 can support the first worm 4141, thereby reducing the disturbance amplitude of the first threaded part 41411 in the radial direction thereof. In some exemplary embodiments, as shown in FIGS. 7 and 8, the first worm 4141 can also include a first transmission rod 41412 connected with the first threaded part 41411. The first transmission rod 41412 can be a cylinder with a smooth surface, and the first transmission rod 41412 can be rotationally connected in the through hole. Such arrangement can reduce the friction between the first worm 4141 and the first support part 415, thereby improving the transmission efficiency of the first transmission component. It should be understood that the first support part 415 can also be of other structures. For example, the through hole of the first support part 415 can be provided therein with a bearing, an outer ring of the bearing can be fixed in the through hole of the first support part 415, and an inner ring of the bearing can be fixedly connected with the first transmission rod 41412.

Figure 9:
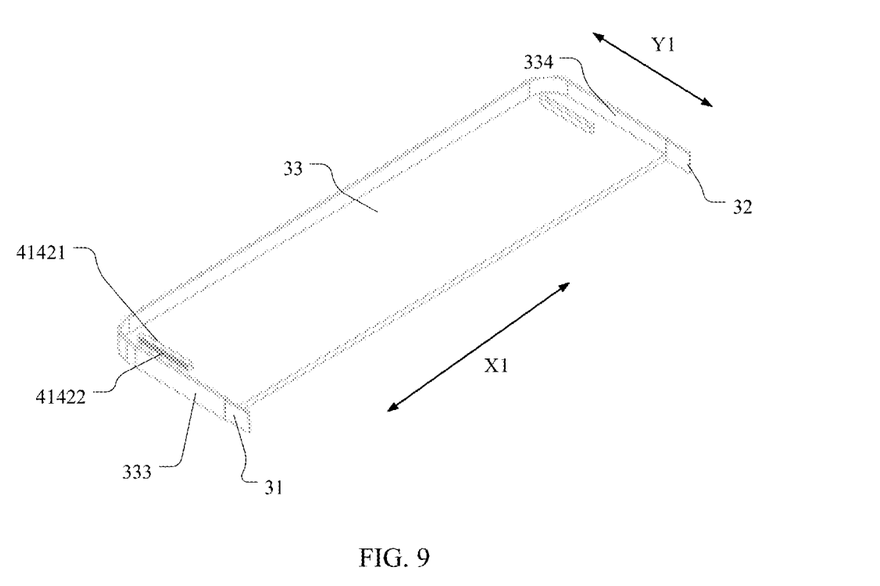
FIG. 9 is a schematic structural diagram of a first sliding middle frame of a middle frame assembly according to exemplary embodiments of the present disclosure.

In some exemplary embodiments, as shown in FIGS. 7 and 9, with FIG. 9 being a schematic structural diagram of a first sliding middle frame of a middle frame assembly according to exemplary embodiments of the present disclosure, the first rack 4142 can include a rack body 41421 and a sawtooth part 41422. The sawtooth part 41422 can be located on a side of the rack body 41421 in the first axial direction X1. Such arrangement can reduce the overall thickness of the middle frame assembly, so as to achieve a thinner display device.

Figure 10:
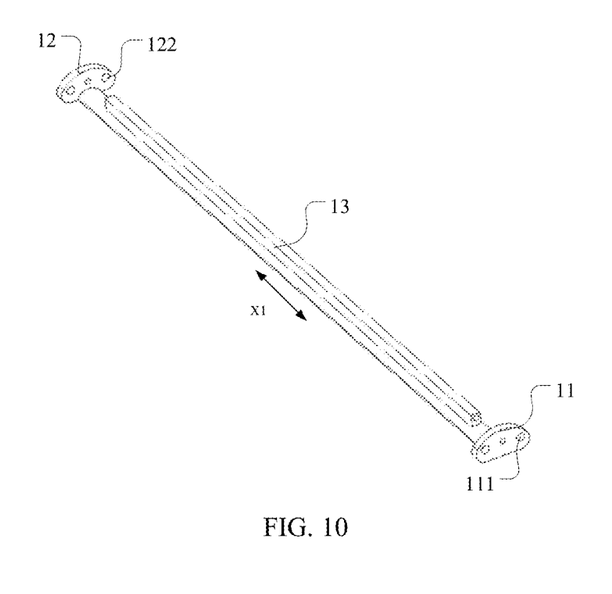
FIG. 10 is a schematic structural diagram of a rotation shaft component of a middle frame assembly according to exemplary embodiments of the present disclosure.
Figure 11:
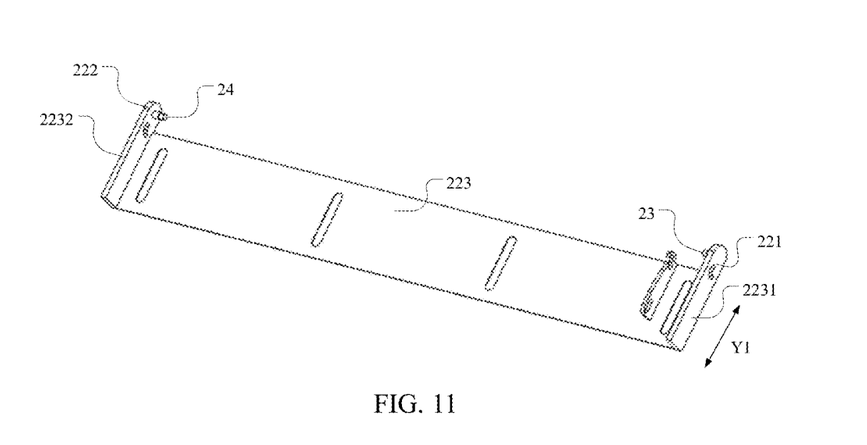
FIG. 11 is a schematic structural diagram of a first baffle of a middle frame assembly according to exemplary embodiments of the present disclosure.

In some exemplary embodiments, as shown in FIGS. 2, 4 and 10, with FIG. 10 being a schematic structural diagram of a rotation shaft component of a middle frame assembly according to exemplary embodiments of the present disclosure, the rotation shaft component 1 can include a rotation shaft body 13, a first connection part 11, and a second connection part 12. The rotation shaft body 13 extends along a direction parallel to the first axial direction X1. The first connection part 11 can be fixedly connected to one end of the rotation shaft body 13 along an extension direction of the rotation shaft body 13, and the first connection part 11 is provided thereon with a first through hole 111. The second connection part can be fixedly connected to the other end of the rotation shaft body 13 along the extension direction of the rotation shaft body 13, and the second connection part 12 is provided thereon with a second through hole 122. As shown in FIGS. 2 and 4, the first middle frame body 2 can also include a first baffle 22, which is fixedly connected with the first main middle frame 21. FIG. 11 is a schematic structural diagram of a first baffle of a middle frame assembly according to exemplary embodiments of the present disclosure, as shown in FIG. 11, the first baffle 22 can include a baffle body 223, a first extension part 221, and a second extension part 222. The baffle body 223 is fixedly connected with the first main middle frame 21. The baffle body 223 can include a first side plate 2231 and a second side plate 2232 opposite to each other. The first extension part 221 extends along the first direction Y1 and is connected with the first side plate 2231 of the baffle body 223, and the first extension part 221 can be connected to the first rotation shaft 23. The second extension part 222 can extend along the first direction Y1 and is connected with the second side plate 2232 of the baffle body 223, and the second extension part 222 is connected to the second rotation shaft 24. In some exemplary embodiments, the first rotation shaft 23 can be rotationally connected in the first through hole 111, and the second rotation shaft 24 can be rotationally connected in the second through hole 122. The first baffle can be used to support other mechanical structures in a bendable display device.

In some exemplary embodiments, as shown in FIGS. 2 and 9, the first sliding middle frame 3 can include a first frame body 33, a first insertion part 31, and a second insertion part 32. The first frame body 33 includes a third side plate 333 and a fourth side plate 334 arranged oppositely to each other and extending along the first direction Y1. The first insertion part 31 is connected with the third side plate 333 and extends along the first direction Y1. The second insertion part 32 is connected with the fourth side plate 334 and extends along the first direction Y1. The first main middle frame can include a second frame body 211. The second frame body 211 can include a fifth side plate 2115 and a sixth side plate 2116 arranged oppositely to each other and extending along the first direction. The fifth side plate 215 is provided with a first groove (not shown) extending along the first direction Y1, and the sixth side plate 216 is provided with a second groove (not shown) extending along the first direction Y1. The first insertion part 31 can be slidely inserted in the first groove, and the second insertion part 32 can be slidely inserted in the second groove. Such arrangement can realize the sliding connection of the first sliding middle frame 3 and the first main middle frame 21 along the first direction Y1.

Exemplary embodiments of the present disclosure also provides a display device, which includes a flexible display panel and the middle frame assembly described above. The first sliding middle frame of the middle frame assembly is fixedly connected to one end of the flexible display panel, and the second sliding middle frame of the middle frame assembly is fixedly connected to the other end of the flexible display panel. The display device can be a foldable mobile phone, a foldable tablet computer, etc.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, the true scope and spirit of the disclosure being indicated by the appended claims.

It should be understood that the present disclosure is not limited to the precise structure described above and shown in the drawings, and various modifications and changes can be made without departing from the scope of the present disclosure, which is limited only by the appended claims.

What is claimed is:

1. A middle frame assembly, comprising:
   a rotation shaft component;
   a first middle frame body rotationally connected to one side of the rotation shaft component along a first axial direction;
   a first sliding middle frame configured to be fixedly connected to one end of a flexible panel, wherein the first sliding middle frame is slidably connected to a side of the first middle frame body away from the rotation shaft component along a first direction, and the first direction is a direction along which getting close to or away from the rotation shaft component; and
   a first transmission component comprising a first sub-transmission component, wherein the first sub-transmission component comprises:
      a first driving bevel gear connected to the first middle frame body and rotatable along the first axial direction under the action of rotation of the first middle frame body relative to the rotation shaft component;
      a second driving bevel gear connected to the first middle frame body and rotatable along the first axial direction under the action of the rotation of the first middle frame body relative to the rotation shaft component, wherein a circumference of a pitch circle of the second driving bevel gear is greater than a circumference of a pitch circle of the first driving bevel gear;
      a first driven bevel gear fixedly connected to the first middle frame body, and configured to mesh with the first driving bevel gear in a first state and with the second driving bevel gear in a second state, wherein the first driven bevel gear is rotatable along a second axial direction under the action of the first driving bevel gear or the second driving bevel gear; and
      a transmission part connected to the first driven bevel gear and the first sliding middle frame, and configured to drive the first sliding middle frame to slide along the first direction relative to the first middle frame body under the action of rotation of the first driven bevel gear;
   wherein the first driving bevel gear comprises:
   a first conical base; and
   a first tooth group formed on a quarter circumference of a conical surface of the first conical base;
   the second driving bevel gear comprises:
   a second conical base; and
   a second tooth group formed on a quarter circumference of a conical surface of the second conical base; and
   the first driven bevel gear comprises:
   a third conical base;
   a third tooth group formed on a conical surface of the third conical base; and
   a fourth tooth group formed on the conical surface of the third conical base, wherein the third tooth group and the fourth tooth group are arranged at intervals on the conical surface of the third conical base, and number of teeth of the fourth tooth group is greater than number of teeth of the third tooth group;
   wherein the first driven bevel gear meshes with the first tooth group through the third tooth group in the first state, and meshes with the second tooth group through the fourth tooth group in the second state.

2. The middle frame assembly according to claim 1, wherein the second axial direction is parallel to the first direction, and the transmission part comprises:
   a first worm fixedly connected to the first driven bevel gear and extending along the second axial direction, wherein the first worm comprises a first threaded part with threaded teeth; and
   a first rack fixedly connected to the first sliding middle frame and extending along the first direction, wherein the first rack meshes with the first threaded part.

3. The middle frame assembly according to claim 2, wherein the first middle frame body comprises:
   a first main middle frame slidably connected to the first sliding middle frame; and
   a first rotation shaft fixedly connected to the first main middle frame, wherein an axial direction of the first rotation shaft is the same as the first axial direction;
   wherein the first driving bevel gear and the second driving bevel gear are coaxially and fixedly connected to the first rotation shaft.

4. The middle frame assembly according to claim 3, wherein the first main middle frame is rotationally connected to the rotation shaft component via the first rotation shaft.

5. The middle frame assembly according to claim 4, wherein
   the first middle frame body further comprises:
   a second rotation shaft fixedly connected to the first main middle frame, wherein the first main middle frame is rotationally connected to the rotation shaft component via the second rotation shaft; and
   the first transmission component further comprises:
   a second sub-transmission component being of the same structure as the first sub-transmission component, wherein the second sub-transmission component and the first sub-transmission component are arranged at intervals along the first axial direction, and the second sub-transmission component is connected to the second rotation shaft.

6. The middle frame assembly according to claim 5, wherein
   the rotation shaft component comprises:
   a rotation shaft body extending along a direction parallel to the first axial direction;
   a first connection part fixedly connected to one end of the rotation shaft body along an extension direction of the rotation shaft body, wherein the first connection part is provided with a first through hole; and
   a second connection part fixedly connected to the other end of the rotation shaft body along the extension direction of the rotation shaft body, wherein the second connection part is provided with a second through hole; and the first middle frame body further comprises a first baffle comprising:
a baffle body is fixedly connected to the first main middle frame, wherein the baffle body comprises a first side plate and a second side plate opposite to each other;
a first extension part extending along the first direction and connected with the first side plate of the baffle body, wherein the first extension part is connected to the first rotation shaft; and
a second extension part extending along the first direction and connected with the second side plate of the baffle body, wherein the second extension part is connected to the second rotation shaft;
wherein the first rotation shaft is rotationally connected in the first through hole, and the second rotation shaft is rotationally connected in the second through hole.

7. The middle frame assembly according to claim 3, wherein
the first sliding middle frame comprises:
a first frame body comprising a third side plate and a fourth side plate arranged oppositely to each other and extending along the first direction;
a first insertion part connected to the third side plate and extending along the first direction; and
a second insertion part connected to the fourth side plate and extending along the first direction; and
the first main middle frame comprises:
a second frame body comprising a fifth side plate and a sixth side plate oppositely to each other and extending along the first direction, wherein the fifth side plate is provided with a first groove extending along the first direction, and the sixth side plate is provided with a second groove extending along the first direction;
wherein the first insertion part is slidably inserted in the first groove, and the second insertion part is slidably inserted in the second groove.

8. The middle frame assembly according to claim 2, wherein the first rack comprises:
a rack body; and
a sawtooth part located on a side of the rack body in the first axial direction.

9. The middle frame assembly according to claim 3, wherein the first sub-transmission component further comprises:
a first support part fixedly connected to a side of the first main middle frame away from the flexible panel, wherein the first support part is provided with a through hole extending along the first direction, and the first worm is rotationally connected in the through hole.

10. The middle frame assembly according to claim 9, wherein the first worm comprises a first transmission rod connected with the first threaded part, the first transmission rod is a cylinder with a smooth surface, and the first transmission rod is rotationally connected in the through hole.

11. The middle frame assembly according to claim 1, further comprising:
a second middle frame body rotationally connected to the other side of the rotation shaft component along a third axial direction;
a second sliding middle frame configured to be fixedly connected to the other end of the flexible panel, wherein the second sliding middle frame is slidably connected to a side of the second middle frame body away from the rotation shaft component along a second direction, and the second direction is a direction along which getting close to or away from the rotation shaft component; and
a second transmission component connected between the second middle frame body and the second sliding middle frame, and configured to drive the second sliding middle frame to slide along the second direction relative to the second middle frame body under the action of rotation of the second middle frame body relative to the rotation shaft component.

12. The middle frame assembly according to claim 11, wherein the first middle frame body and the second middle frame body have the same structure, the first sliding middle frame and the second sliding middle frame have the same structure, and the first transmission component and the second transmission component have the same structure.

13. The middle frame assembly according to claim 1, wherein the flexible panel is a flexible display panel.

14. A display device, comprising:
a flexible display panel; and
a middle frame assembly, comprising:
a rotation shaft component;
a first middle frame body rotationally connected to one side of the rotation shaft component along a first axial direction;
a first sliding middle frame configured to be fixedly connected to one end of a flexible panel, wherein the first sliding middle frame is slidably connected to a side of the first middle frame body away from the rotation shaft component along a first direction, and the first direction is a direction along which getting close to or away from the rotation shaft component;
a first transmission component comprising a first sub-transmission component, wherein the first sub-transmission component comprises:
a first driving bevel gear connected to the first middle frame body and rotatable along the first axial direction under the action of rotation of the first middle frame body relative to the rotation shaft component;
a second driving bevel gear connected to the first middle frame body and rotatable along the first axial direction under the action of the rotation of the first middle frame body relative to the rotation shaft component, wherein a circumference of a pitch circle of the second driving bevel gear is greater than a circumference of a pitch circle of the first driving bevel gear;
a first driven bevel gear fixedly connected to the first middle frame body, and configured to mesh with the first driving bevel gear in a first state and with the second driving bevel gear in a second state, wherein the first driven bevel gear is rotatable along a second axial direction under the action of the first driving bevel gear or the second driving bevel gear; and
a transmission part connected to the first driven bevel gear and the first sliding middle frame, and configured to drive the first sliding middle frame to slide along the first direction relative to the first middle frame body under the action of rotation of the first driven bevel gear;
a second middle frame body rotationally connected to the other side of the rotation shaft component along a third axial direction;

a second sliding middle frame configured to be fixedly connected to the other end of the flexible panel, wherein the second sliding middle frame is slidably connected to a side of the second middle frame body away from the rotation shaft component along a second direction, and the second direction is a direction along which getting close to or away from the rotation shaft component; and a second transmission component connected between the second middle frame body and the second sliding middle frame, and configured to drive the second sliding middle frame to slide along the second direction relative to the second middle frame body under the action of rotation of the second middle frame body relative to the rotation shaft component;

wherein the first sliding middle frame of the middle frame assembly is fixedly connected to one end of the flexible display panel, and the second sliding middle frame of the middle frame assembly is fixedly connected to the other end of the flexible display panel.

15. The display device according to claim 14, wherein the first middle frame body and the second middle frame body have the same structure, the first sliding middle frame and the second sliding middle frame have the same structure, and the first transmission component and the second transmission component have the same structure.

16. The middle frame assembly according to claim 10, wherein the first support part is provided therein with a bearing, an outer ring of the bearing is fixed in the through hole of the first support part, and an inner ring of the bearing is fixedly connected with the first transmission rod.

17. The middle frame assembly according to claim 2, further comprising:
a second middle frame body rotationally connected to the other side of the rotation shaft component along a third axial direction;
a second sliding middle frame configured to be fixedly connected to the other end of the flexible panel, wherein the second sliding middle frame is slidably connected to a side of the second middle frame body away from the rotation shaft component along a second direction, and the second direction is a direction along which getting close to or away from the rotation shaft component; and
a second transmission component connected between the second middle frame body and the second sliding middle frame, and configured to drive the second sliding middle frame to slide along the second direction relative to the second middle frame body under the action of rotation of the second middle frame body relative to the rotation shaft component.

18. The middle frame assembly according to claim 1, further comprising:
a second middle frame body rotationally connected to the other side of the rotation shaft component along a third axial direction;
a second sliding middle frame configured to be fixedly connected to the other end of the flexible panel, wherein the second sliding middle frame is slidably connected to a side of the second middle frame body away from the rotation shaft component along a second direction, and the second direction is a direction along which getting close to or away from the rotation shaft component; and
a second transmission component connected between the second middle frame body and the second sliding middle frame, and configured to drive the second sliding middle frame to slide along the second direction relative to the second middle frame body under the action of rotation of the second middle frame body relative to the rotation shaft component.

19. The middle frame assembly according to claim 17, wherein the first middle frame body and the second middle frame body have the same structure, the first sliding middle frame and the second sliding middle frame have the same structure, and the first transmission component and the second transmission component have the same structure.

* * * * *